(12) United States Patent
Varghese et al.

(10) Patent No.: US 12,727,278 B2
(45) Date of Patent: Sep. 1, 2026

(54) OPTOELECTRONIC DEVICE

(71) Applicant: ams-OSRAM International GmbH, Regensburg (DE)

(72) Inventors: Tansen Varghese, Regensburg (DE); Martin Hetzl, Painten (DE); Dirk Becker, Langquaid (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 368 days.

(21) Appl. No.: 18/700,592

(22) PCT Filed: Sep. 8, 2022

(86) PCT No.: PCT/EP2022/074959
§ 371 (c)(1),
(2) Date: Apr. 11, 2024

(87) PCT Pub. No.: WO2023/061668
PCT Pub. Date: Apr. 20, 2023

(65) Prior Publication Data

US 2024/0413260 A1 Dec. 12, 2024

(30) Foreign Application Priority Data

Oct. 15, 2021 (DE) ......................... 102021126740.4

(51) Int. Cl.
*H10F 55/00* (2025.01)

(52) U.S. Cl.
CPC .................................... *H10F 55/00* (2025.01)

(58) Field of Classification Search
CPC ........ H10F 55/00; H10F 55/25; H10F 77/146; H10F 77/1437; H10W 90/00
See application file for complete search history.

(56) References Cited

U.S. PATENT DOCUMENTS

| | | | |
|---|---|---|---|
| 6,265,653 | B1 | 7/2001 | Haigh et al. |
| 2007/0152225 | A1 | 7/2007 | Ooi et al. |
| 2013/0119409 | A1 | 5/2013 | Zhao |
| 2013/0181208 | A1 | 7/2013 | Guo |
| 2014/0061679 | A1 | 3/2014 | Guo |
| 2018/0351026 | A1 | 12/2018 | Waechter et al. |

(Continued)

FOREIGN PATENT DOCUMENTS

| | | | |
|---|---|---|---|
| DE | 102018109532 | A1 | 10/2019 |
| TW | 201320321 | A1 | 5/2013 |

(Continued)

OTHER PUBLICATIONS

Voignier, V. (Authorized officer), International Search Report and Written opinion dated Nov. 28, 2022, PCT Application No. PCT/EP2022/074959, 8 pages.

(Continued)

*Primary Examiner* — Thanh Y. Tran
(74) *Attorney, Agent, or Firm* — MH2 Technology Law Group LLP

(57) ABSTRACT

An optoelectronic device is specified, said device including a emitter configured to emit electromagnetic radiation having two or more peak wavelengths and to be operated with an input voltage, and a receiver configured to receive the electromagnetic radiation and to provide an output voltage.

16 Claims, 5 Drawing Sheets

(56) References Cited

U.S. PATENT DOCUMENTS

| | | | | |
|---|---|---|---|---|
| 2020/0081472 | A1 | 3/2020 | Lumb | |
| 2021/0083141 | A1* | 3/2021 | Scheller | G06F 1/163 |

FOREIGN PATENT DOCUMENTS

| | | | |
|---|---|---|---|
| TW | 201733148 | A | 9/2017 |
| WO | 2013067805 | A1 | 5/2013 |
| WO | 2021055140 | A1 | 3/2021 |

OTHER PUBLICATIONS

German Office Action issued in corresponding German Patent Application No. 10 2021 126 740.4 dated Apr. 28, 2022, 8 pages.

Mohammed, A. M. et al.: "Quantum Well Intermixing: The Quest for Orange and Yellow Lasers"https://Compoundsemiconductor.net/article/99566/Quantum_well_intermixing_The_quest_for_orange_and_yellow_lasers; Jun. 16, 2016.

* cited by examiner

OPTOELECTRONIC DEVICE

CROSS-REFERENCE TO RELATED APPLICATIONS

The present application is a national stage entry from International Application No. PCT/EP2022/074959, filed on Sep. 8, 2022, published as International Publication No. WO 2023/061668 A1 on Apr. 20, 2023, and claims priority to German Patent Application No. 10 2021 126 740.4, filed Oct. 15, 2021, the disclosures of all of which are hereby incorporated by reference in their entireties.

FIELD

An optoelectronic device is specified herein.

BACKGROUND

A problem to be solved is to specify an optoelectronic device which can be designed to be particularly compact.

SUMMARY

According to at least one aspect, the optoelectronic device comprises an emitter. The emitter is configured to emit electromagnetic radiation. For example, the emitter may be a device that generates electromagnetic radiation in the wavelength range between infrared radiation and ultraviolet radiation.

In particular, the emitter may be configured to generate electromagnetic radiation in the wavelength range from at least 350 nm to at most 1600 nm, during operation. Further, the emitter is adapted to be operated with an input voltage.

In cases where the optoelectronic device comprises two or more emitters, the emitters are connected in parallel with each other. The emitter or the emitters are configured to be operated with the input voltage.

According to at least one aspect of the optoelectronic device, the emitter is configured to emit electromagnetic radiation having two or more peak wavelengths. A peak wavelength is the wavelength where the radiometric emission spectrum of the electromagnetic radiation has a maximum. If the electromagnetic radiation has two or more peak wavelengths, the radiometric emission spectrum has two or more local maxima, wherein each maximum corresponds to one of the peak wavelengths. For this the emitter, for example, has two or more active regions, wherein each active region is configured to emit part of the electromagnetic radiation, wherein each peak wavelength is assigned to a single active zone of the emitter.

In this way each active zone is configured to emit electromagnetic radiation with one of the peak wavelengths. The electromagnetic radiation emitted by the emitter is a composition of the radiation emitted by the active zones.

According to at least one aspect of the optoelectronic device, the optoelectronic device comprises a receiver.

The receiver is configured to receive the electromagnetic radiation of the emitter and to provide at least part of an output voltage of the optoelectronic device. In particular, the receiver is configured to receive the electromagnetic radiation emitted by the emitter during operation and to convert it at least partially into electrical energy. In particular, the receiver can be tuned to the emitter in such a way that the receiver has a particularly high absorption for the electromagnetic radiation generated by the emitter.

According to at least one aspect of the optoelectronic device, the optoelectronic device comprises

- an emitter configured to emit electromagnetic radiation having two or more peak wavelengths and configured to be operated with an input voltage, and
- a receiver configured to receive the electromagnetic radiation and configured to provide an output voltage.

The optoelectronic device described herein is based on the following considerations, among others.

Many applications, such as in acoustics, beam steering technologies such as MEMS, actuators, detectors such as avalanche photodiodes, single photon avalanche diodes, or photomultipliers, require high voltage supplies with relatively low power consumption. Such applications may require voltages in excess of 50 V, 100 V, 500 V, 1000 V, 2000 V, 10000 V, and more, while maintaining a small device footprint in terms of size, weight, cost, and power consumption. These characteristics are especially important for mobile devices such as AR/VR glasses, wearable in-ear headsets, and automotive applications.

Another problem to be solved for high-voltage generators with small footprint is the connection of low-voltage and high-voltage paths, which should be galvanically separated to ensure the functional reliability and long-term stability of a device under changing environmental conditions such as temperature, humidity, dust.

The optoelectronic device described here can advantageously be used as an optical voltage converter. Further, with the optoelectronic device described herein, it is also possible to convert a high voltage on the side of the emitters to a low voltage on the side of the receivers. Furthermore, with the present device, it is possible to transform an AC voltage into a DC voltage and vice versa. Finally, the present device also makes it possible to transfer galvanically isolated power from the side of the emitters to the side of the receivers without changing the voltage.

The optoelectronic device described here can thus form, for example, a transformer that can do without inductive elements, in particular without coils. On the one hand, this makes the installation space particularly small compared to conventional transformers, and on the other hand, no or only small magnetic fields are generated during the transformation. This also rules out any influence from external magnetic and/or electric fields. Thus, the optoelectronic device can be used in areas for which magnetic interference would be critical or which are subject to high external magnetic fields. At the same time, the optical power transmission in the optoelectronic device ensures galvanic isolation from the high-voltage side and the low-voltage side.

Another idea of the device described here is to combine semiconductor light emitters and receivers, i.e. comprising photodiodes or photovoltaic cells, to achieve a conversion from low to high voltage. For this purpose on the low voltage side of the device, one or more emitters connected in parallel emit light. The wavelength of the emitted light can be between 350 nm and 1600 nm, depending on the semiconductor materials used, for example: In(Ga)N, In(Ga)AlP, (Al)GaAs, (In)GaAs. Typical input voltages are 1 V, 3 V, 5 V, 8 V, 10 V or in between.

On the high voltage side, which is galvanically isolated from the low voltage side, series-connected receivers, e.g. photodiodes operating in photovoltaic mode, collect the emitted light. Depending on the material used, for example Si, InGaAs, GaAs, InGaN or perovskite, the photodiode generates a voltage in the order of 0.5-3 V and a current depending on the intensity of the incident light. By using a large number of photodiodes, all of which can be connected in series on a very small wafer scale, these individual voltages add up to a high total voltage that can exceed 10, 50, 100, 500, 1000, or 10000 V.

Overall, the present device enables the transmission of energy and/or the conversion of voltage in a particularly compact component. The optoelectronic device is thereby insensitive to external influences such as temperature fluctuations or electromagnetic fields.

In the following the optoelectronic device described herein is explained in more detail by means of exemplary embodiments and the associated figures.

According to at least one aspect of the optoelectronic device, the active zones are monolithically integrated with each other. That is to say, the emitter for example comprises a semiconductor body which is grown epitaxially. The semiconductor body comprises the active zones, for example as layer sequences or other structures like nanorods or nanowires. The active zones are grown together, for example, during the same growth process and are hence monolithically integrated with each other.

According to at least one aspect of the optoelectronic device, the peak wavelengths are set by quantum well intermixing. That is to say, for example after the growth of the emitter and the active zones of the emitter, quantum well intermixing is used to obtain different bandgaps and therefore different peak wavelengths in different active zones. The intermixing can, for example, be done by diffusion, implanting or application of strain by another layer, e.g. by a dielectric or a metal layer. Thereby different compositions of layers, for example dielectric layers, produce different levels of strain and therefore different wavelengths in the active zones.

To set the peak wavelengths by quantum well intermixing has the advantage that the production comprises a simple epitaxy process but yields multiple peak wavelengths on the same wafer. Further, multiple peak wavelengths do not get absorbed by the emitter itself and therefore the emission efficiency is increased. Multiple peak wavelengths also lead to a higher current and a higher voltage on the receiver side.

According to at least one aspect of the optoelectronic device, the active zones are arranged spaced apart from one another in a lateral direction. A lateral direction is a direction which, for example, runs in parallel to a plane of main extension of the emitter. For example, the active zones are arranged one after another along a lateral direction. Further it is possible that the active zones are arranged at the nodes of a regular lattice in a common plane. In this case, the active zones are arranged spaced apart from one another in two lateral directions.

According to at least one aspect of the optoelectronic device, each active zone is comprised by a nanowire or a nanorod. That is to say, the active zone which emits part of the electromagnetic radiation of the emitter with a single peak wavelength is comprised by a nanowire or a nanorod.

For example, the nanowires or the nanorods can be grown laterally spaced apart from each other on a common growth surface. In this way many active zones, for example 1000 or more active zones, can be incorporated into one emitter. According to this aspect of the optoelectronic device, groups of the active zones can emit electromagnetic radiation with the same peak wavelengths such that the optoelectronic device, for example, emits electromagnetic radiation with two, three or more peak wavelengths, where the number of peak wavelengths is lower than the number of active zones.

According to at least one aspect of the optoelectronic device, the emitter is an edge-emitting device which is configured to emit the electromagnetic radiation in a lateral direction and the receiver is configured to receive the electromagnetic radiation from the lateral direction. The lateral direction is in the same plane as the lateral direction explained above.

In the present context, an edge-emitting device is understood to be a radiation-emitting component which emits the electromagnetic radiation generated during operation transversely, in particular perpendicularly, to a side surface or facet of the device. The electromagnetic radiation is then emitted, for example, through the side surface or facet.

In particular, the edge-emitting device may be a semiconductor device comprising an epitaxially grown semiconductor body. In particular, the direction in which the electromagnetic radiation is then emitted during operation may be oblique or perpendicular to a growth direction of the semiconductor body. For example, the semiconductor body may be based on semiconductor materials such as In(Ga)N, In(Ga)AlP, (Al)GaAs, (In)GaAs.

The edge-emitting device may be, for example, a light-emitting diode or a laser diode.

Thereby it is also possible that the emitter emits the electromagnetic radiation from two sides, for example through two facets or side surfaces which are arranged opposite each other in the edge-emitting device.

According to at least one aspect of the optoelectronic device, the emitter comprises an edge-emitting device and is configured to emit the electromagnetic radiation from two opposite sides and from each side another part of the receiver is illuminated. In this case the receiver is separated in at least two parts. Both parts can be electrically connected with each other and are, for example, connected in series with each other. Each part is arranged downstream in an emission direction on a different side of the emitter. With this higher currents and higher voltages at the output side of the optoelectronic device are possible.

According to at least one aspect of the optoelectronic device, the emitter comprises two or more converters and each converter is configured to emit electromagnetic radiation with different peak wavelengths. According to this aspect, the different peak wavelengths of the electromagnetic radiation emitted by the emitter are due to converters.

These converters can be, for example, quantum dot converters, ceramic converters or in particular nanowires or nanorods. In the case that the converters are nanowires or nanorods, these nanowires or nanorods can be, for example, bonded or epitaxially grown onto an emission surface of the emitter. In each case, the emitter comprises an active zone which produces primary radiation and the converters convert most or all of the primary radiation into secondary radiation. Thereby different types of converters convert to secondary radiation with different peak wavelengths.

According to at least one aspect of the optoelectronic device, the receiver comprises a plurality of photodiodes. That is to say, the receiver is for example an array of photodiodes which can be arranged spaced apart from each other in lateral directions.

In the case that the receiver comprises two or more parts, each part of the receiver can be formed in such a way that it comprises a plurality of photodiodes. For example, the parts of the receiver are formed in the same manner and each part of the receiver comprises the same number and the same kind of photodiodes.

According to this aspect it is possible that different photodiodes are tuned to different peak wavelengths of the electromagnetic radiation emitted by the emitter. That is to say, the absorption of electromagnetic radiation is higher at the respective peak wavelength than at other wavelengths.

The receiver comprises different types of photodiodes, wherein the absorption for each photodiode is highest for one of the peak wavelengths.

According to at least one aspect of the optoelectronic device, all photodiodes are connected in series with each other. That is to say, all photodiodes of a receiver or all photodiodes of a part of the receiver, are connected in series with each other. In this way, especially high output voltages can be achieved.

According to at least one aspect of the optoelectronic device, each photodiode comprises two or more active regions, wherein each active region is tuned to one of the peak wavelengths. The active region of each photodiode is the detecting region where the electromagnetic radiation is absorbed and transformed to electric energy.

It is possible that each photodiode comprises two or more active regions which are, for example, arranged one after another in the direction of the electromagnetic radiation running through the photodiode. At least some or all the active regions of at least some or each photodiode are electrically connected in series with each other. When such a photodiode is illuminated with the electromagnetic radiation in a first active region of the photodiode on which the electromagnetic radiation impinges first, electromagnetic radiation with the smaller peak wavelength is absorbed. In the subsequent active region or active regions, electromagnetic radiation of further, higher peak wavelengths is absorbed. Thereby, the active regions of at least some or each photodiode are electrically connected in series with each other by a tunnel junction or by a transparent conductive oxide (TCO) like Indium Tin Oxide (ITO).

In this way the electromagnetic radiation emitted by the emitter can be efficiently absorbed and transformed to electric energy by the photodiodes.

According to at least one aspect of the optoelectronic device, the input voltage of the device is lower than the output voltage of the device. For example the input voltage is in the range of 1 V to 5 V and the output voltage is in the range of 500 V, 1000 V or higher.

In the following the optoelectronic device described herein is explained in more detail by means of exemplary embodiments and the associated figures.

DETAILED DESCRIPTION

In these exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

Figure 1:
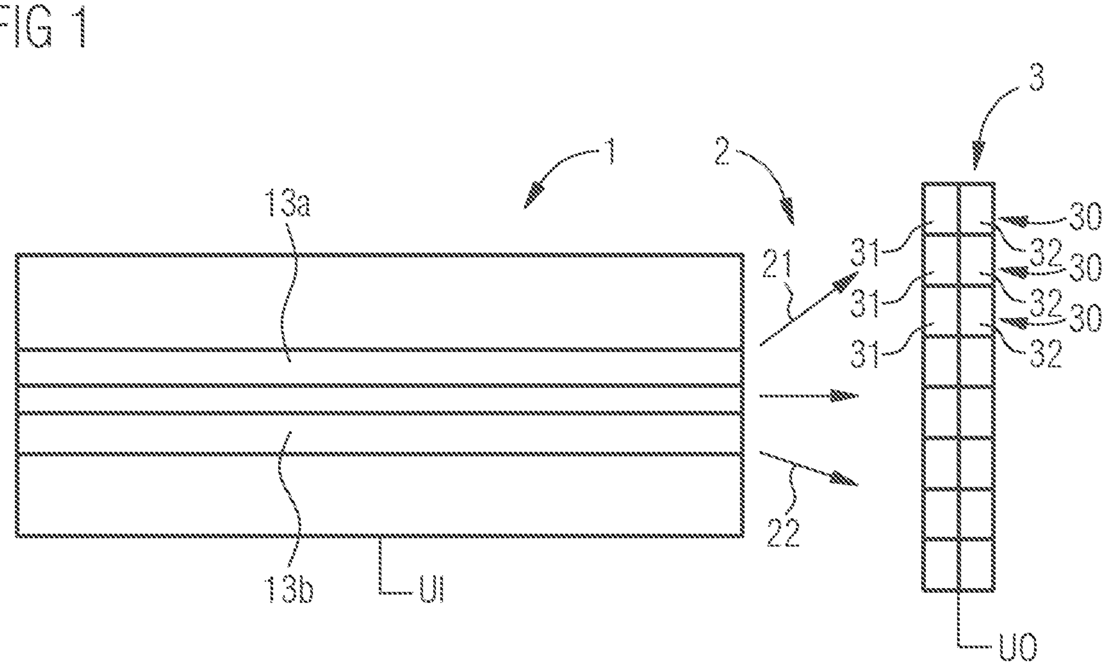
FIG. 1 schematically shows an optoelectronic device according to the present disclosure.

FIG. 1 shows an embodiment of a here described optoelectronic device in a schematic top view. The optoelectronic device comprises an emitter 1. The emitter 1 is configured to emit electromagnetic radiation 2 having two peak wavelengths 21, 22.

The emitter 1 comprises active zones 13*a*, 13*b*. Each active zone 13*a*, 13*b* of the emitter is configured to emit electromagnetic radiation with one of the peak wavelengths 21, 22. For example, the first active zone 13*a* emits electromagnetic radiation with the peak wavelength 21 and the second active zone 13*b* of the emitter emits electromagnetic radiation with the peak wavelength 22. For example, the peak wavelength 22 which is emitted by the second active zone 13*b* is lower than the peak wavelength 21 emitted by the first active zone 13*a* of the emitter 1. The emitter 1 may comprise further active zones emitting electromagnetic radiation with further peak wavelengths.

The emitter 1 is operated with the input voltage UI.

The device further comprises a receiver 3. The receiver 3 is adapted to receive the electromagnetic radiation and to provide an output voltage UO.

The emitter 3 comprises a plurality of photodiodes 30 which are connected in series with each other. Each photodiode 30 of the receiver 3 comprises two active regions 31, 32. The photodiodes 30 can be designed to have different active regions, so that the absorption of light is approximately equal in all the photodiodes.

For example, the areas of the active regions increase from the center to the edges of the receiver 3. In this way photodiodes 30 at the edges of the receiver 3 have a larger active region than photodiodes 30 near the center of the receiver 3. This enables the current of each photodiode to be approximately equal, even if the distance to the emitter and the angle of incident light is different for different photodiodes. This improves the efficiency of the entire device.

The first active region 31 is tuned to absorb electromagnetic radiation 2 with a peak wavelength 22 which has a higher energy than electromagnetic radiation 2 with a peak wavelength 21. The second active region 32 of each photodiode 30 is tuned to absorb the electromagnetic radiation 2 with the lower energy peak wavelength 21.

The active regions 31, 32 of each photodiode 30 are connected in series with each other and all photodiodes 30 are connected in series with each other.

The optoelectronic device as explained in connection with FIG. 1 therefore has a multi-wavelength emitter 1 which illuminates a multi-junction photodiode array which generates higher voltage and higher current in each photodiode 30 as is the case for single-junction photodiodes.

Figure 2:
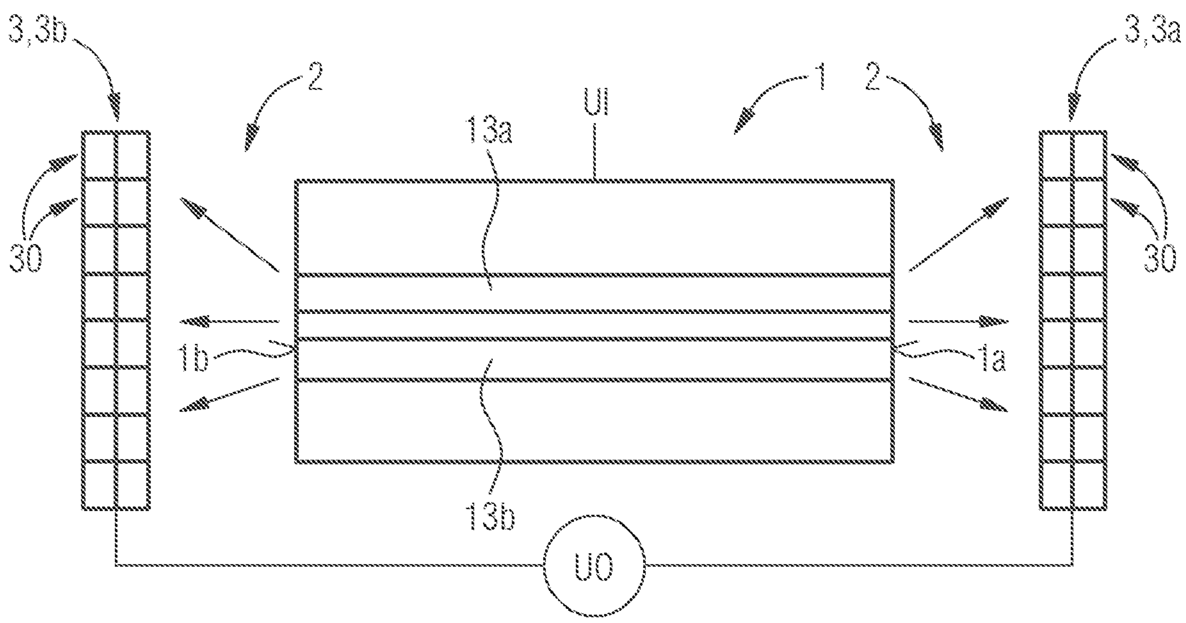
FIG. 2 schematically shows an optoelectronic device according to the present disclosure.

In connection with the schematic sectional view of FIG. 2, a further embodiment of a here described optoelectronic device is described in more detail. In addition to the embodiment described with regard to FIG. 1, according to this embodiment the emitter emits the electromagnetic radiation 2 from two opposite sides 1*a*, 1*b*.

On each side a part 3*a*, 3*b* of the receiver 3 is arranged downstream in an emission direction of the emitter 1. For this the emitter 1 emits the electromagnetic radiation 2 from both sides 1*a*, 1*b*.

The parts 3*a*, 3*b* of the receiver 3 each comprise a plurality of multi-junction photodiodes 30. All photodiodes 30 of both parts 3*a*, 3*b* of the receiver 3 are connected in series with each other. With this even higher output voltages UO and higher currents than for the embodiment in FIG. 1 are possible.

Figure 3A:
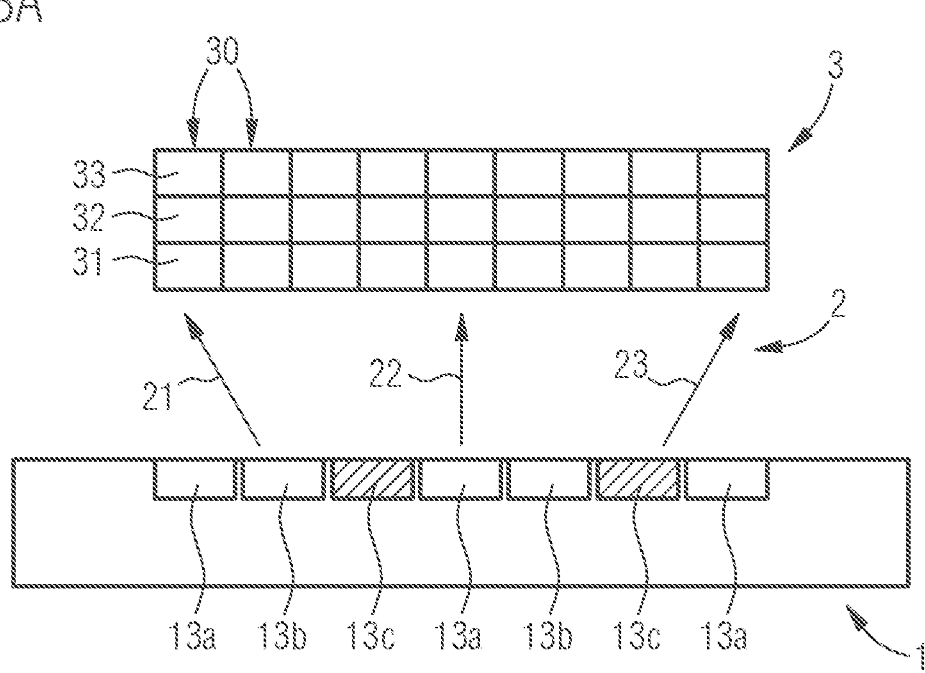
FIGS. 3A, 3B, and 3C schematically show an optoelectronic device according to the present disclosure.
Figure 3B:
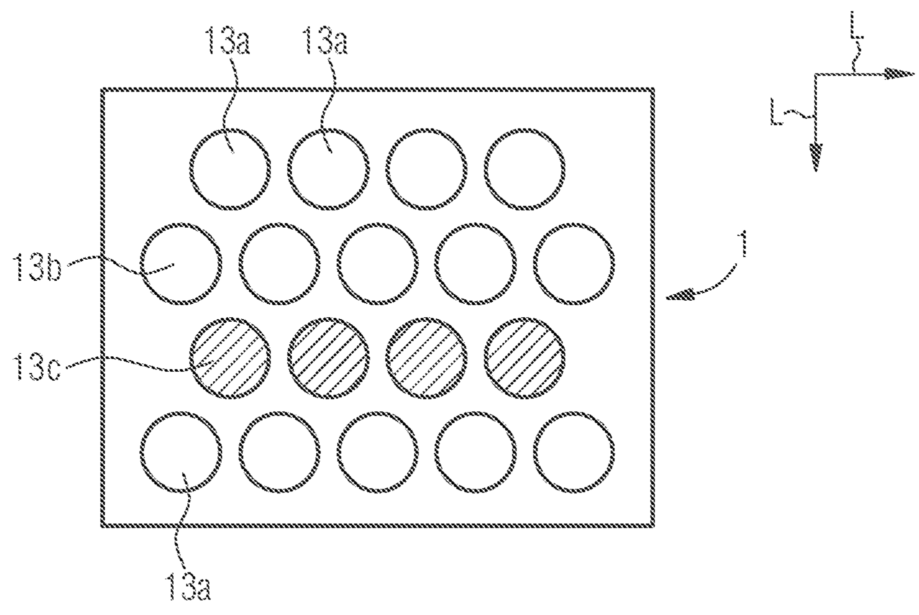

In connection with the schematic illustrations of FIGS. 3A and 3B a further embodiment of a here described optoelectronic device is described in more detail.

FIG. 3A shows a schematic sectional view of the embodiment, FIG. 3B shows a schematic top view of the emitter 1 of this embodiment.

In this embodiment the emitter 1 comprises active zones 13*a*, 13*b*, 13*c* which are arranged spaced apart from each other in lateral directions L. Each active zone 13*a*, 13*b*, 13*c* comprises a surface-emitting device like, for example a VCSEL, an LED, an SLED (Super Luminescent LED) or another surface-emitting device.

The active zones 13*a*, 13*b*, 13*c* are arranged in an area, for example at the nodes of a regular lattice.

The active zones 13*a*, 13*b*, 13*c* are configured to emit electromagnetic radiation with one of the peak wavelengths 21, 22, 23.

The receiver 3 is comprised of a plurality of photodiodes 30, wherein each photodiode 30 comprises active regions 31, 32, 33 in which the electromagnetic radiation is accordingly absorbed. Each active region is tuned to one of the peak wavelengths of the electromagnetic radiation 2.

Figure 3C:
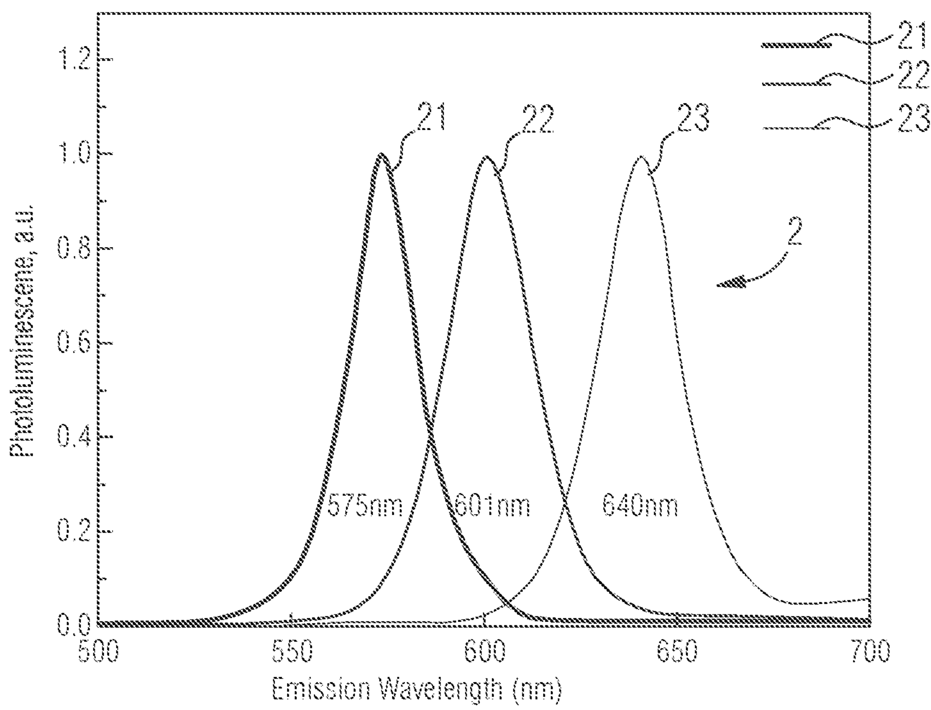

The graphical illustration of FIG. 3C shows the emission spectrum of such an emitter 1 with the peak wavelengths 21, 22, 23 of the electromagnetic radiation 2.

The active zones of the emitters 1 as shown in the embodiments of FIGS. 1 through 3 can be monolithically integrated with each other, for example by growing the active zones in a common wafer. The peak wavelengths of the active zones can be set by quantum well intermixing. For this after the growth of the active zones, quantum well intermixing is used to obtain different bandgaps and therefore peak wavelengths for active zones which are laterally spaced apart from each other.

Figure 4A:
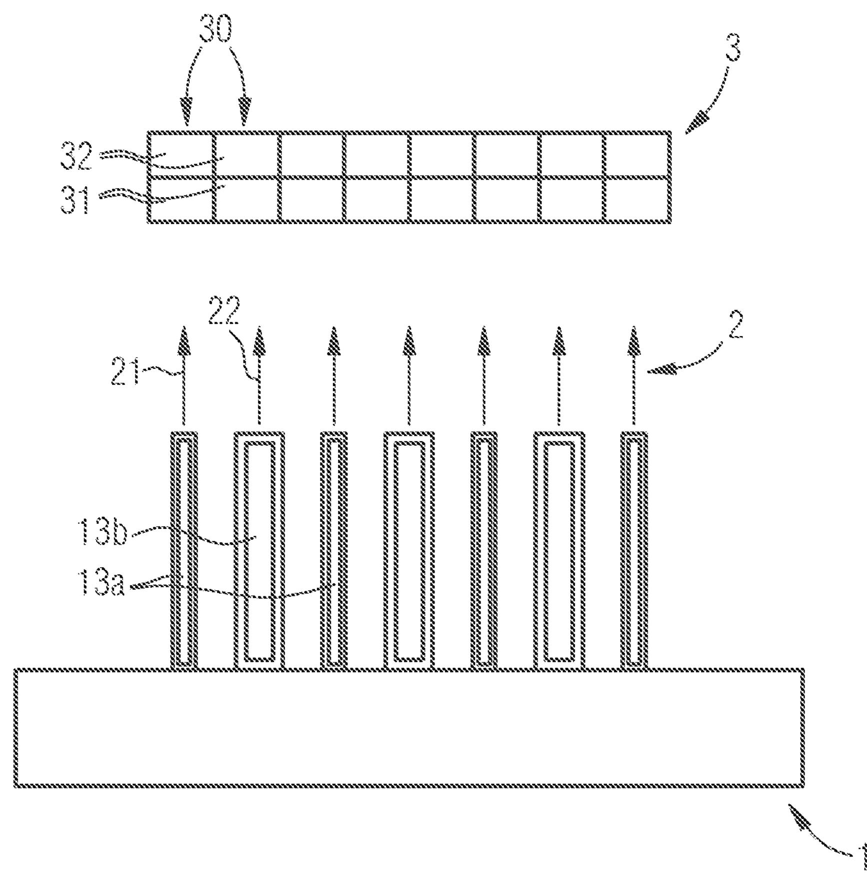
FIGS. 4A and 4B schematically show an optoelectronic device according to the present disclosure.
Figure 4B:
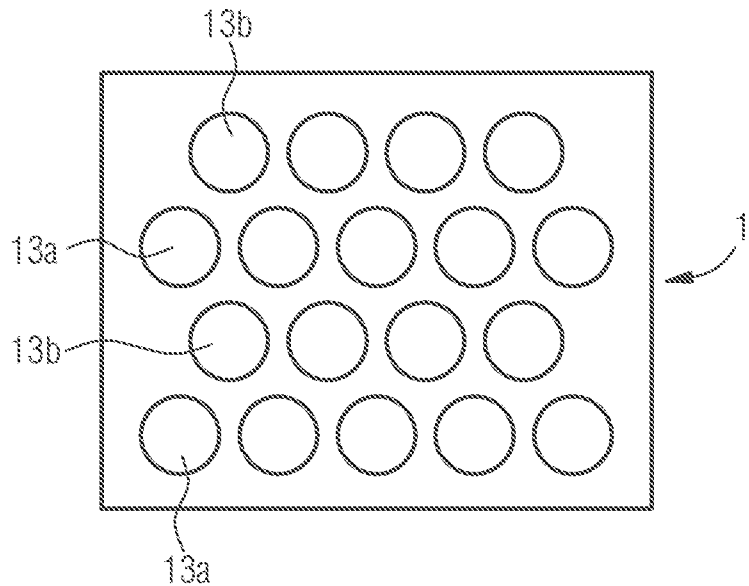

In connection with FIGS. 4A and 4B a further embodiment of a here described optoelectronic device is described with respect to schematic illustrations.

FIG. 4A shows a schematic side view of the embodiment. FIG. 4B shows a schematic top view of the emitter 1 of the embodiment.

In this embodiment active nanowires or nanorods, for example core-shell nanorods, are used for forming the active zones 13*a*, 13*b* of the emitter 1. Each nanowire or nanorod acts as an active zone, wherein for example the peak wavelength of each active zone is set by the thickness of the quantum wells in the active zones and/or the incorporation for example of indium. These are in turn dependent on the diameter of the core.

The diameter of different wires can be made different, for example, by different sized openings in the dielectric mask used for defining the epitaxial growth areas. This allows for monolithic growth of the active zones, where different peak wavelengths are established in the same growth process.

Again, a receiver 3 is arranged downstream in the direction of emission. For example, the receiver 3 has a plurality of photodiodes 30 each comprising an active region 31, 32 tuned to the peak wavelengths 21, 22 of the electromagnetic radiation 2.

As shown in FIG. 4B the nanowires or nanorods can be arranged at the nodes of a regular lattice.

Figure 5A:
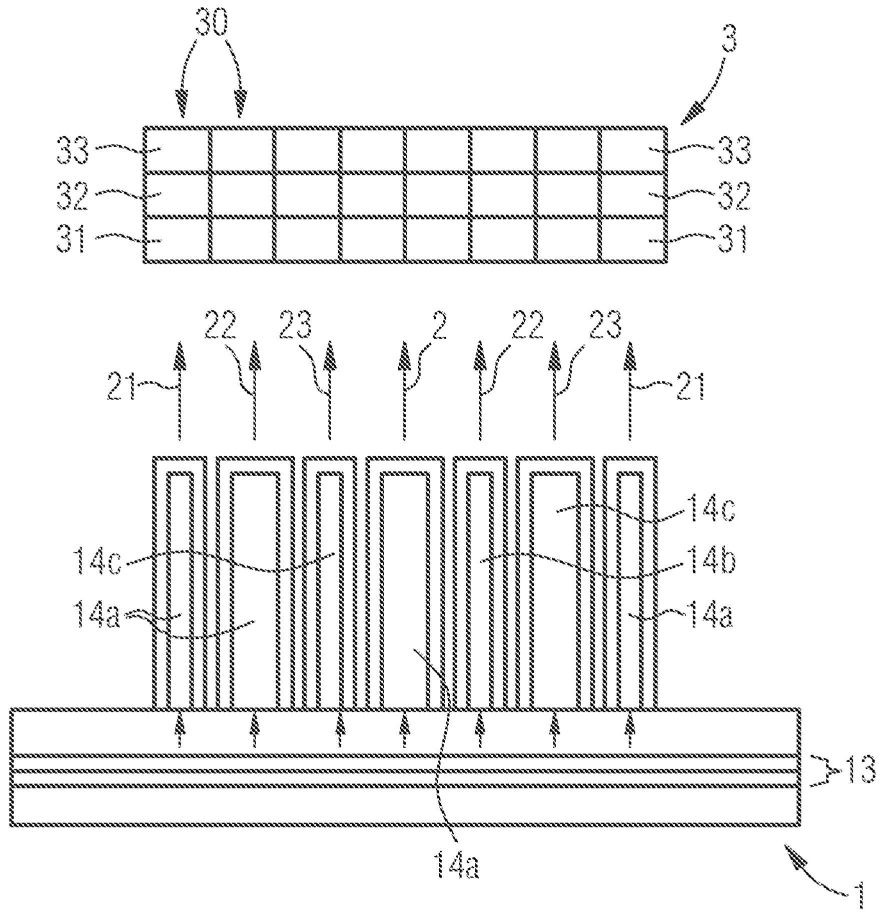
FIGS. 5A and 5B schematically show an optoelectronic device according to the present disclosure.
Figure 5B:
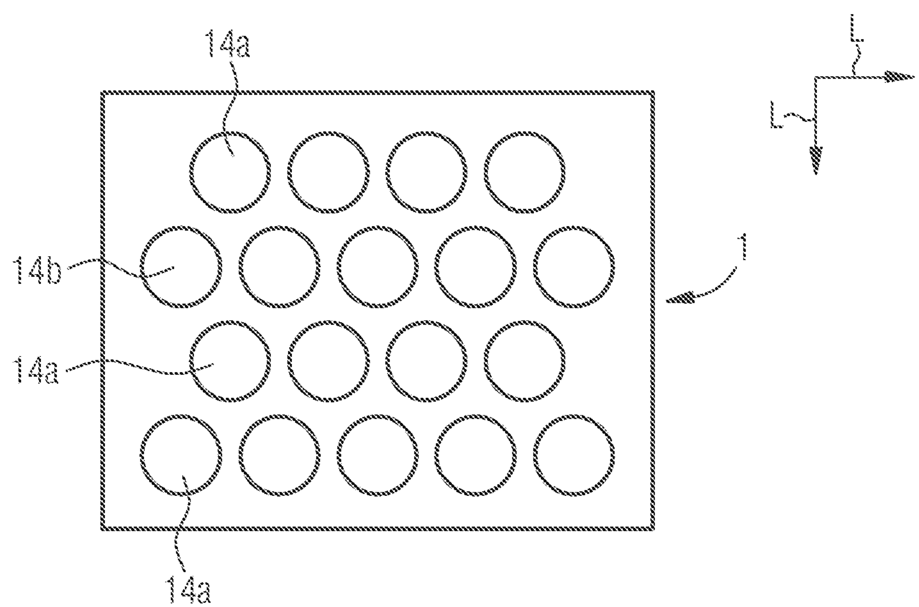

In connection with the schematic illustrations of FIG. 5A and FIG. 5B, a further embodiment of a here described optoelectronic device is described in more detail.

FIG. 5A shows a schematic sectional view of the embodiment. FIG. 5B shows a schematic top view of the emitter 1 of the embodiment.

In this embodiment the emitter 1 has an active zone 13 which produces a primary radiation which is converted by converters 14*a* through 14*c* into the electromagnetic radiation 2 having the peak wavelengths 21, 22, 23.

For example, the converters are formed by passive nanowires. However, ceramic or quantum dot converters are also feasible.

Via optical pumping and excitation of the converters 14*a*, 14*b*, 14*c* the electromagnetic radiation 2 is produced. The emitter 1 therefore comprises an LED, a VCSEL, or another device as the primary light source. The converters have, for example, a core-shell composition and comprise materials like GaAs, GaN/AlGaAs, AlGaN. Lattice mismatch between the materials of the nanowires leads to diameter-dependent strain in each converter 14*a*, 14*b*, 14*c* and therefore to a bandgap shift which allows for different peak wavelengths 21, 22, 23. This diameter-dependent peak wavelength can be set in one growth process. The receiver comprises a plurality of photodiodes 30 which comprise active regions 31, 32, 33 which are tuned to one of the peak wavelengths 21, 22, 23.

The converters 14*a*, 14*b*, 14*c* can be arranged at the nodes of a regular lattice as, for example, shown in FIG. 5B.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. An optoelectronic device comprising a emitter configured to emit electromagnetic radiation having two or more peak wavelengths and to be operated with an input voltage, and a receiver configured to receive the electromagnetic radiation and to provide an output voltage, wherein the emitter comprises an edge-emitting device and is configured to emit the electromagnetic radiation from two opposite sides and from each side another part of the receiver is illuminated, the receiver comprises a plurality of photodiodes, and each photodiode comprises two or more active regions.

2. The optoelectronic device according to claim 1, wherein the emitter comprises two or more active zones and each active zone is configured to emit electromagnetic radiation with one of the peak wavelengths.

3. The optoelectronic device according to claim 2, wherein the active zones are monolithically integrated with each other.

4. The optoelectronic device according to claim 1, wherein the peak wavelengths are set by quantum well intermixing.

5. The optoelectronic device according to claim 1, wherein each active zone comprises a nanowire or a nanorod.

6. The optoelectronic device according to claim 1, wherein the active zones are arranged spaced apart from each other in a lateral direction.

7. The optoelectronic device according to claim 1, wherein the emitter comprises two or more converters and each converter is configured to emit electromagnetic radiation with one of the peak wavelengths.

8. The optoelectronic device according to claim 7, wherein each converter comprises a nanowire or a nanorod.

9. The optoelectronic device according to claim 1, wherein each part of the receiver comprises a plurality of photodiodes.

10. The optoelectronic device according to claim 1, wherein all photodiodes are connected in series with each other.

11. The optoelectronic device according to claim 1, wherein each active region is tuned to one of the peak wavelengths.

12. The optoelectronic device according to claim 1, wherein the input voltage is lower than the output voltage.

13. The optoelectronic device according to claim 1, wherein the areas of the active regions increase from the center to the edges of the receiver.

14. An optoelectronic device, comprising:

a emitter configured to emit electromagnetic radiation having two or more peak wavelengths and to be operated with an input voltage, and a receiver configured to receive the electromagnetic radiation and to provide an output voltage, wherein the receiver comprises a plurality of photodiodes, and each photodiode comprises two or more active regions, which are arranged one after another in the direction of the electromagnetic radiation running through the photodiode.

15. An optoelectronic device, comprising:

a emitter configured to emit electromagnetic radiation having two or more peak wavelengths and to be operated with an input voltage, and a receiver configured to receive the electromagnetic radiation and to provide an output voltage, wherein the receiver comprises a plurality of photodiodes, and each photodiode comprises two or more active regions, the active regions of each photodiode are electrically connected in series with each other and each active region is tuned to one of the peak wavelengths, wherein in a first active region electromagnetic radiation with a smaller peak wavelength is absorbed.

16. The optoelectronic device according to claim 15, wherein the active regions of each photodiode are electrically connected in series with each other by a tunnel junction or by a transparent conductive oxide.

* * * * *